United States Patent [19]

Inagawa et al.

[11] Patent Number: 4,574,361

[45] Date of Patent: Mar. 4, 1986

[54] APPARATUS FOR DIVIDING THE ELEMENTS OF A GALOIS FIELD

[75] Inventors: Jun Inagawa, Yokohama; Masahide Nagumo, Kawasaki; Tadashi Kojima, Yokosuka, all of Japan

[73] Assignee: Tokyo Shibaura Denki Kabushiki Kaisha, Kawasaki, Japan

[21] Appl. No.: 473,765

[22] Filed: Mar. 10, 1983

[30] Foreign Application Priority Data

Jun. 15, 1982 [JP] Japan ................................ 57-102803
Jun. 15, 1982 [JP] Japan ................................ 57-102805

[51] Int. Cl.$^4$ .............................................. G06F 7/52
[52] U.S. Cl. .................................................. 364/761
[58] Field of Search ...................... 364/761, 764, 765; 371/37

[56] References Cited

U.S. PATENT DOCUMENTS

| | | | |
|---|---|---|---|
| 3,828,175 | 8/1974 | Amdahl et al. ..................... | 364/765 |
| 4,099,160 | 7/1978 | Flagg ................................... | 371/37 |
| 4,142,174 | 2/1979 | Chen ................................... | 371/37 |
| 4,473,887 | 9/1984 | Odaka ................................. | 364/761 |

FOREIGN PATENT DOCUMENTS 0012828  7/1980  European Pat. Off. .
2081479  2/1982  United Kingdom .

OTHER PUBLICATIONS

Davida, "Inverse of Elements of a Galois Field", *Electronics Letters*, vol. 8, No. 21, Oct. 19, 1972, pp. 518–520.
Chien, "Cyclic Decoding Procedures for Bose–Chaudhuri–Hocquenghem Codes", *IEEE Trans. on Infor. Theory*, vol. IT-10, No. 4, Oct. 1964, pp. 357–363.
Steen, "Error Correction for Voice Grade Data Communication Using a Communication Processor", *IEEE Trans. on Communication*, vol. COM-22, No. 10, Oct. 1974, pp. 1595–1606.

*Primary Examiner*—David H. Malzahn
*Attorney, Agent, or Firm*—Cushman, Darby & Cushman

[57] ABSTRACT

An apparatus divides one element $\alpha^i$ of a Galois field $GF(2^m)$ by another element $\alpha^j$ of the field. Divider data $\alpha^j$ are supplied to one of the first linear shift registers and to the other first linear shift registers through $\alpha^{N1}$, $\alpha^{N2}$, . . . multiplier circuits, respectively. Simultaneously, dividend data $\alpha^i$ are supplied to one of the second linear shift registers and to the other second linear shift registers through $\alpha^{N1}$, $\alpha^{N2}$, . . . multiplier circuits, respectively. "1" detector circuits are connected to the outputs of the first linear shift registers, respectively. The first linear shift registers and the second linear shift registers are shifted several times until any "1" detector circuit detects "1" in response to output signals from a 2-input AND gate. When "1" is detected, a NOR gate supplies a signal of logical "0" to the AND gate, whereby the AND gate stops supplying output signals. 2-input AND circuits are connected at one input terminal to the outputs of the "1" detector circuits and at the other input terminal to the outputs of the second linear shift registers. The AND circuit connected to the "1" detector circuit supplies the data stored in the second linear shift register to which it is connected. The data representing the quotient of the division $\alpha^i - \alpha^j$, are delivered through an OR circuit.

6 Claims, 13 Drawing Figures

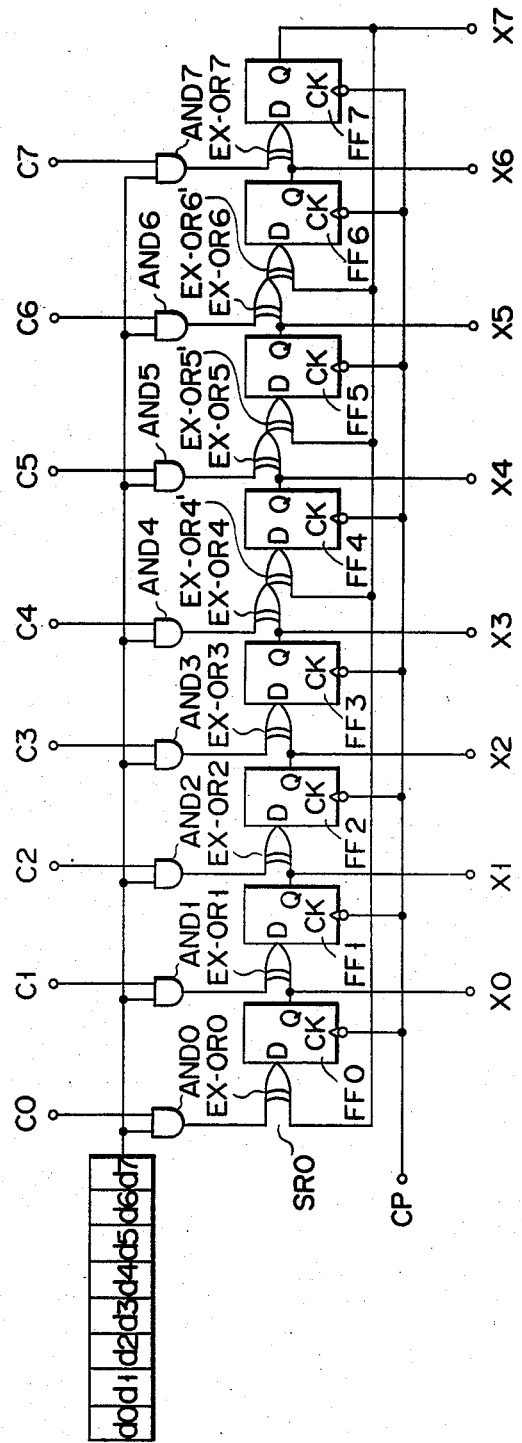
F I G. 5

APPARATUS FOR DIVIDING THE ELEMENTS OF A GALOIS FIELD

BACKGROUND OF THE INVENTION

The present invention relates to an apparatus for dividing the elements of a Galois field, which can effectively serve to decode an error correction code used in an optical DAD (digital audio disk) device using, for example, a CD (compact disk).

Various optical DAD devices have been developed recently. As is well known, in an optical DAD device using a compact disk, cross-interleaved Reed Solomon codes (CIRC) are used as error correction codes. A cross-interleaved Reed Solomon code is obtained by submitting a Reed Solomon code, which is a BCH code and which is generally regarded as the most effective random error correction code hitherto known, to a signal process called "cross-interleaving". The cross-interleaved Reed Solomon code thus obtained can correct even a burst error.

A Reed Solomon code can be decoded in the same way as is a BCH code, thereby performing an error correction.

A Reed Solomon code consisting of k data symbols and (n-k) inspection symbols, i.e., a code consisting of n symbols, is decoded in the following manner. Here, n symbols are the $2^m$ elements of a finite field called "Galois field $GF(2^m)$" which represents m binary bits. The generator polynomial $g_{(x)}$ representing a Reed Solomon code used to correct an error t times is given by the following equation (1) or (2), where $\alpha$ is the origin element of the Galois field $GF(2^m)$:

$$g_{(x)}=(x+\alpha)(x+\alpha^2),\ldots(x+\alpha^{2t}) \quad (1),$$

$$g_{(x)}=(x+\alpha^0)(x+\alpha),\ldots(x+\alpha^{2t-1}) \quad (2).$$

Let $C_{(x)}$, $R_{(x)}$ and $E_{(x)}$ denote a transmitted code word, a received code word and an error polynomial respectively, then:

$$R_{(x)}=C_{(x)}+E_{(x)} \quad (3).$$

The coefficients contained in polynomial $E_{(x)}$ are also contained in Galois field $GF(2^m)$. Hence, the error polynomial $E_{(x)}$ contains only terms which correspond to an error location and the value (i.e., size) of an error.

Let $X_j$ denote an error location, and let $Y^j$ denote the value of the error at location $X^j$. Error polynominal $E_{(x)}$ is then given as:

$$E_{(x)} = \sum_j Y_j X^j, \quad (4)$$

where $\Sigma$ is the sum of errors at all error locations. Here, syndrome $S_i$ is put:

$$S_i=R(\alpha^i) \quad [i=0, 1, \ldots 2t-1] \quad (5).$$

Then, from equation (3):

$$S_1=C(\alpha^i)+E(\alpha^i).$$

Both $C_{(x)}$ and $g_{(x)}$ can be divided, leaving no remainder. The following therefore holds true:

$$S_i=E(\alpha^i).$$

From equation (4) it is evident that syndrome $S_i$ may be expressed as follows:

$$S_i=E(\alpha^i)=\Sigma\, Y_j(\alpha^i)^j=\Sigma\, Y_j X_j^i \quad (6),$$

where $\alpha^j=X_j$ and $X_j$ represents the error location for $\alpha^j$.

Error location polynomial $\sigma_{(x)}$ is given by:

$$\sigma_{(x)} = \prod_i (x - X_i) \quad (7)$$

$$= x^e + \sigma_1 x^{e-1} + \ldots + \sigma_e,$$

where e is the number of errors.

$\sigma_1$ to $\sigma_e$ in equation (7) are related to syndrome $S_i$ as shown below:

$$S_{i+e}+\sigma_1 S_{i+e-1}+\ldots \sigma_{e-1}S_{i+1}+\sigma_e S_i \quad (8).$$

In other words, such a Reed Solomon code as defined above is decoded in the following steps:

(I) Calculate syndrome $S_i$ [equation (5)].
(II) Obtain coefficients $\sigma_1$ to $\sigma_e$ contained in error location polymonial $\sigma_{(x)}$ [equation (8)].
(III) Find the root $X_j$ of error location polynomial $\sigma_{(x)}$ [equation (7)].
(IV) Find error value $Y_j$ [equation (6)], and calculate error polynomial [equation (4)].
(V) Correct errors [equation (3)].

Now it will be described how to decode, in the above-mentioned steps, a Reed Solomon code consisting of many block data each containing four inspection symbols. This code is represented by the following polynomial $g_{(x)}$:

$$g_{(x)}=(x+1)(x+\alpha)(x+\alpha^2)(x+\alpha^3).$$

In this case, an error can be corrected two times. The Reed Solomon code may be decoded in the following method A or the following method B.

[Method A]

(I) Find syndromes $S_0$ to $S_3$.
(II) Rewrite equation (8) for e=1 and e=2.

$$\left.\begin{array}{l}\underline{\text{In the case of } e = 1:}\\ S_1 + \sigma_1 S_0 = 0 \\ S_2 + \sigma_1 S_1 = 0 \\ S_3 + \sigma_1 S_2 = 0\end{array}\right\} \quad (9).$$

$$\left.\begin{array}{l}\underline{\text{In the case of } e = 2:}\\ S_2 + \sigma_1 S_1 + \sigma_2 S_0 = 0 \\ S_3 + \sigma_1 S_2 + \sigma_2 S_1 = 0\end{array}\right\} \quad (10).$$

Assume that the decoder used starts functioning with the case of e=1. Solution $\sigma_1$ must then be given which satisfies simultaneous equations (9). If no solution $\sigma_1$ is found, the decoder must find solutions $\sigma_1$ and $\sigma_2$ which satisfy simultaneous equations (10). If still no solution $\sigma_1$ or $\sigma_2$ is found, then: e=3.

Solution $\sigma_1$ of equations (9) is:

$$\sigma_1 = \frac{S_1}{S_0} = \frac{S_2}{S_1} = \frac{S_3}{S_2}.$$

Solutions $\sigma_1$ and $\sigma_2$ of equations (10) are:

$$\sigma_1 = \frac{S_0 S_3 + S_1 S_2}{S_1^2 + S_0 S_2}, \sigma_2 = \frac{S_1 S_3 + S_2^2}{S_1^2 + S_0 S_2}.$$

(III) If coefficient $\sigma_1$ in the error location polynominal is obtained, find the root of the error location polynominal [equation (7)].

<u>In the case of $e = 1$:</u>
$\sigma_{(x)} = x + \sigma_1 = 0$. Therefore, $X_1 = \sigma_1$.
<u>In the case of $e = 2$:</u>
$\sigma_{(x)} = X^2 + \sigma_1 x + \sigma_2 = 0$.

Substituting the elements of Galois field GF($2^m$) in equation (11) one after another will yield roots $X_1$ and $X_2$.

(IV) If roots of the error location polynominal are found, determine error value $Y_j$ [equation (6)].

<u>In the case of $e = 1$:</u>
$S_0 = Y_1$. Therefore, $Y_1 = S_0$.

<u>In the case of $e = 2$:</u>

$$\left. \begin{array}{l} S_0 = Y_1 + Y_2 \\ S_1 = Y_1 X_1 + Y_2 X_2 \end{array} \right\}$$

Therefore: $Y_1 = \frac{X_2 S_0 + S_1}{X_1 + X_2}$ $Y_2 = S_0 + Y_1$.

(V) Correct error using correction values $Y_1$ and $Y_2$ thus obtained.

If the value of an error location is correctly found by the pointer erasure method, the Reed Solomon code used to correct an error twice can be used to correct an error four times in the following method B.

[Method B]

(I) Find syndromes $S_0$ and $S_3$.
(II), (III) Find the error location in different methods.
(IV) Find the error value [equation (6)].

<u>In the case of $e = 1$:</u>
Same as in Method A.

<u>In the case of $e = 2$:</u>
Same as in Method A.

<u>In the case of $e = 3$:</u>

$$\left. \begin{array}{l} S_0 = Y_1 + Y_2 + Y_3 \\ S_1 = Y_1 X_1 + Y_2 X_2 + Y_3 X_3 \\ S_2 = Y_1 X_1^2 + Y_2 X_2^2 + Y_3 X_3^2 \end{array} \right\}$$

Solve these simultaneous equations, thus finding $Y_1$, $Y_2$ and $Y_3$:

$$Y_1 = \frac{(S_2 + X_3 S_1) + X_2(S_1 + X_3 S_0)}{(X_1 + X_2)(X_1 + X_3)}$$

$$Y_2 = \frac{(S_1 + X_3 S_0) + Y_1(X_1 + X_3)}{(S_2 + X_3)}$$

$Y_3 = S_0 + Y_1 + Y_2$.

<u>In the case of $e = 4$:</u>

$$\left. \begin{array}{l} S_0 = Y_1 + Y_2 + Y_3 + Y_4 \\ S_1 = Y_1 X_1 + Y_2 X_2 + Y_3 X_3 + Y_4 X_4 \\ S_2 = Y_1 X_1^2 + Y_2 X_2^2 + Y_3 X_3^2 + Y_4 X_4^2 \\ S_2 = Y_1 X_1^3 + Y_2 X_2^3 + Y_3 X_3^3 + Y_4 X_4^3 \end{array} \right\}$$

Solve these simultaneous equations, thus finding $Y_1$, $Y_2$, $Y_3$ and $Y_4$:

$$Y_1 = \frac{[(S_0 X_4 + S_1)X_3 + (S_1 X_4 + S_2)]X_2 + (S_1 X_4 + S_2)X_3 + (S_2 X_4 + S_3)}{(X_1 + X_2)(X_1 + X_3)(X_1 + X_4)}$$

$$Y_2 = \frac{(S_0 X_4 + S_1)S_3 + (S_1 X_4 + S_2) + Y_1(X_1 + X_3)(X_1 + X_4)}{(X_2 + X_3)(X_2 + X_4)}$$

$$Y_3 = \frac{(S_0 X_4 + S_1) + Y_1(X_1 + X_4) + Y_2(X_2 + X_4)}{(X_3 + X_4)}$$

$Y_4 = S_0 + Y_1 + Y_2 + Y_3$.

(V) Correct error, using correction values $Y_1$, $Y_2$, $Y_3$ and $Y_4$ thus obtained.

FIG. 1 is a block diagram of a known data correcting system which is designed to decode Reed Solomon codes in the manner described above. Data to be corrected are supplied through an input terminal IN and will be corrected by a Reed Solomon code. The data are stored in a data buffer 11 and kept stored there until a code decoding (later described) is completed. The data are supplied also to a syndrome calculator 12. The calculator 12 calculates a syndrome based on the input data and the syndrome is then stored in a syndrome buffer 13.

An OR gate is coupled to the output of the syndrome buffer 13. It generates an output signal which indicates whether or not an error exists in the syndrome supplied from the syndrome buffer 13. An output signal from the OR gate is supplied to an error location polynomial calculator 15. Upon receipt of the signal the calculator 15 finds the coefficients included in an error location polynomial $\sigma_{(x)}$. Data representing the coefficients are fed to an error location calculator 16. The error location calculator 16 then finds the root or roots of the error location polynomial. Data representing the root or roots are supplied from the calculator 16 to an error value calculator 17. From the input data the calculator 17 calculates an error value. The data representing the root or roots and the data representing the error value are used to correct the data from the data buffer 11.

The calculators 12, 15, 16 and 17 of the data correcting system can detect elements which are "0" and can therefore perform algebraic operations such as addition, multiplication or division. Of these calculators, the error location polynomial calculator 16 may have such a structure as shown in FIG. 2 and disclosed in U.S. Pat. No. 4,142,174.

As shown in FIG. 2, the error location polynomial calculator 16 comprises a syndrome buffer 21, a working buffer 22, a sequence controller 23, a logarithm buffer 24 and an antilogarithm buffer 25. The syndrome buffer 21 is a random-access memory (RAM) for storing a syndrome $S_i$ which is m-bit data and which represents each element of a Galois field GF($2^m$). The working buffer 22 is a RAM for storing an interim result of an algebraic operation performed in finding the coefficients of the error location polynomial and for storing the final result of the algebraic operation. The working buffer 22 may store partial results that will be used in algebraic operations which follow the operations for calculating the coefficients of the error location polynomial. The sequence controller 23 defines the order in which algebraic operations will be performed. It supplies address signals to the syndrome buffer 21 and the working buffer 22, to thereby designate desired memory locations of these buffers 21 and 22 and to check and branch the results of algebraic operations so that the results may be used in the next algebraic operations. The logarithm buffer 24 is a ROM (read-only memory) storing a table of the logarithms of the elements of a Galois field $GF(2^m)$. The antilogarithm buffer 25 is also a ROM storing a table of the antilogarithms of the elements of a Galois field $GF(2^m)$.

The address of the logarithm buffer 24 is a binary code of element $\alpha^i$. Its entry is the logarithm of $\alpha$ to the base a that is, i. The entry at address i of the antilogarithm buffer 25 is a binary code of $\alpha^i$.

Suppose the modulus polynomial $F_{(x)}$ of a Galois field $GF(2^8)$ is given by:

$$F_{(x)} = x^8 + x^6 + x^5 + x^4 + 1.$$

The elements of Galois field $GF(2^8)$ other than element 0 can then be represented by a linear combination of powers to the root $\alpha$ of $F_{(x)}=0$, or $\alpha^0$–$\alpha^7$, which is expressed as follows:

$$\sum_{i=0}^{7} a_i \alpha^i, \text{ where } a_i = 0 \text{ or } 1.$$

In this case, eight coefficients $a_0$ to $a_7$ may be taken and can be represented as binary vectors. For example, they can be given by:

$$\alpha^1 = 0 \cdot \alpha^0 + 1 \cdot \alpha^1 + 0 \cdot \alpha^2 + 0 \cdot \alpha^3 + 0 \cdot \alpha^4 + 0 \cdot \alpha^5 + 0 \cdot \alpha^6 + 0 \cdot \alpha^7$$
$$= (01000000)$$
$$\alpha^7 = 0 \cdot \alpha^0 + \ldots + 0 \cdot \alpha^6 + 1 \cdot \alpha^7 = (00000001)$$
$$\alpha^8 = 1 + \alpha^4 + \alpha^5 + \alpha^6 = (10001110)$$
$$\alpha^9 = \alpha \cdot \alpha^8 = \alpha + \alpha^5 + \alpha^6 + \alpha^7 = (01000111).$$

The elements of the Galois field $GF(2^8)$ other than these can be represented as binary vectors.

The addresses 1–255 of the logarithm table are 8-bit binary vectors of elements $\alpha^i$. Entries corresponding to the addresses are in binary notation of exponent i. In the antilogarithm table, exponent i is used as an address, and entries are binary vectors of $\alpha^i$.

How the error location polynomial calculator shown in FIG. 2 performs algebraic operations will now be described.

(1) Addition

In order to add element $\alpha^i$ and element $\alpha^j$, the former is supplied from A register 20 to an exclusive OR gate 27 and the latter is supplied from B register 26 to the exclusive OR gate 27. An exclusive logical sum of each bit of element $\alpha^i$ and the corresponding bit of element $\alpha^j$ is thus produced. The logical sum of elements $\alpha^i$ and $\alpha^j$ obtained by the exclusive OR gate 27 is transferred through C register 19 to the working buffer 22.

(2) Detection of Element "0"

In order to detect whether or not element $\alpha^i$ is "0", the element is supplied from H register 28 to an OR gate 29, which produces a logical sum. The logical sum is transferred via M register 30 to the working buffer 22. The contents of M register 30 are "0", only when element $\alpha^i$ is "0".

(3) Multiplication

In order to multiply element $\alpha^i$ by element $\alpha^j$, it is first detected whether or not these elements are "0". If at least one of these elements is "0", it is learned without performing the multiplication that the product will be "0". If neither is "0", the elements are loaded into an address register 31 which is connected to the logarithm buffer 24. Outputs i and j from the logarithm buffer 24 are supplied to a ones complement adder 34 through D register 32 and E register 33, respectively. The ones complement adder 34 performs addition of a complement to 1, using $2^8-1$ as a modulus. The result of this addition, $(i+j) = t \mod (2^8-1)$ is loaded through L register 35 into an address register 36 which is connected to the antilogarithm buffer 25. If the address input of the antilogarithm buffer 25 is t, the antilogarithm buffer 25 supplies an output $\alpha^t$. The output $\alpha^t$ is the product of elements $\alpha^i$ and $\alpha^j$ and is transferred to the working buffer 22 through G register 37.

(4) Division

In order to divide element $\alpha^i$ by element $\alpha^j$ to obtain a quotient $\alpha^i/\alpha^j$, a method similar to the above-mentioned multiplication is used, but the contents of E register 33 are subtracted from the contents of D register 32. More specifically, the logarithm of element $\alpha^j$ stored in E register 33 is complemented by a complementer 38. The output data of the complementer 38 are supplied to the complement adder 34 via F register 39. Thereafter, the data are processed in the same way as in multiplying element $\alpha^i$. In this case, the output from the antilogarithm buffer 25 is the quotient, i.e., the result of the division.

The error location polynomial calculator of the known error correcting system must be provided with a logarithm buffer and an antilogarithm buffer. Without these buffers, the error location polynomial calculator could not perform multiplication or division. Both buffers, which are ROMs, need to have an enormously large memory capacity. This makes it difficult to manufacture the error location polynomial calculator in the form of an LSI. In order to make the calculator in the form of an LSI, the logarithm buffer and the antilogarithm buffer must be excluded from the calculator. In this case, the buffers having a large memory capacity have to be connected to the calculator.

If one symbol consists of eight bits and each buffer stores 255 symbols, the buffer must have a memory capacity of 2040 bits $(=255 \times 8)$. In this case, the known error location polynomial calculator is provided with two ROMs the total memory capacity of which amounts to 4080 bits. One of the ROMs stores a table of logarithms and the other ROM stores a table of antilogarithms. Since its error location polynomial calculator has two ROMs both with a large memory capacity, the error correcting system is inevitably complicated, and thus expensive.

SUMMARY OF THE INVENTION

An object of the present invention is to provide an apparatus for dividing the elements of a Galois field, which has neither a logarithm buffer nor an antilogarithm buffer, both of which require a large memory capacity, and which therefore has a simple structure and can be manufactured at low cost.

An apparatus according to the invention divides one element $\alpha^i$ of the Galois field GF($2^m$) by another element $\alpha^j$ of the Galois field GF($2^m$), where $\alpha$ is a root of modulus polynomial $F_{(x)}$. In other words, the apparatus performs the division: $\alpha^i \div \alpha^j (= \alpha^{i-j})$. Data representing element $\alpha^j$ are supplied to one of the first linear shift registers through a data line and to the other first linear shift registers through data lines and then through $\alpha^{N1}$, $\alpha^{N2}$ . . . multiplier circuits (1<N1<N2, . . . ). Data representing $\alpha^i$ are supplied to one of the first linear shift registers through a data line and to the other first linear shift registers through data lines and then through other $\alpha^{N1}$, $\alpha^{N2}$, . . . multiplier circuits (1<N1<N2, . . . ). A plurality of "1" detector circuits are connected to the outputs of the first linear shift registers, respectively, to detect whether or not the outputs from the first linear shift registers represent "1". Until any one of the "1" detector circuits detects "1", the first linear shift registers and the second linear shift registers are shifted several times by shift means. A plurality of 2-input gate circuits are connected at one input to the outputs of the "1" detector circuits, respectively, and at the other input to the outputs of the second linear shift registers, respectively. The output data from the second linear shift register which corresponds to the first linear shift register connected to the "1" detector circuit which detects "1" are delivered through output means as data representing the quotient of the division.

According to the present invention, the elements of the Galois field GF($2^m$) are divided by using linear shift registers. More precisely, the linear shift registers are used to multiply the elements of the Galois field GF($2^m$) and ulimately, to divide the elements of the Galois field GF($2^m$). Both dividend $\alpha^i$ and divider $\alpha^j$ are multiplied by $\alpha$ a proper number of times before the data representing them are supplied to the linear shift registers, and so the linear shift registers need to be shifted fewer times than otherwise, thus performing multiplication (and ultimately, division) in a shorter time.

BRIEF DESCRIPTION OF THE DRAWINGS

FIG. 5 is a circuit diagram of a multiplier used in the apparatus shown in FIG. 4;

DETAILED DESCRIPTION OF THE PREFERRED EMBODIMENTS

Figure 3:
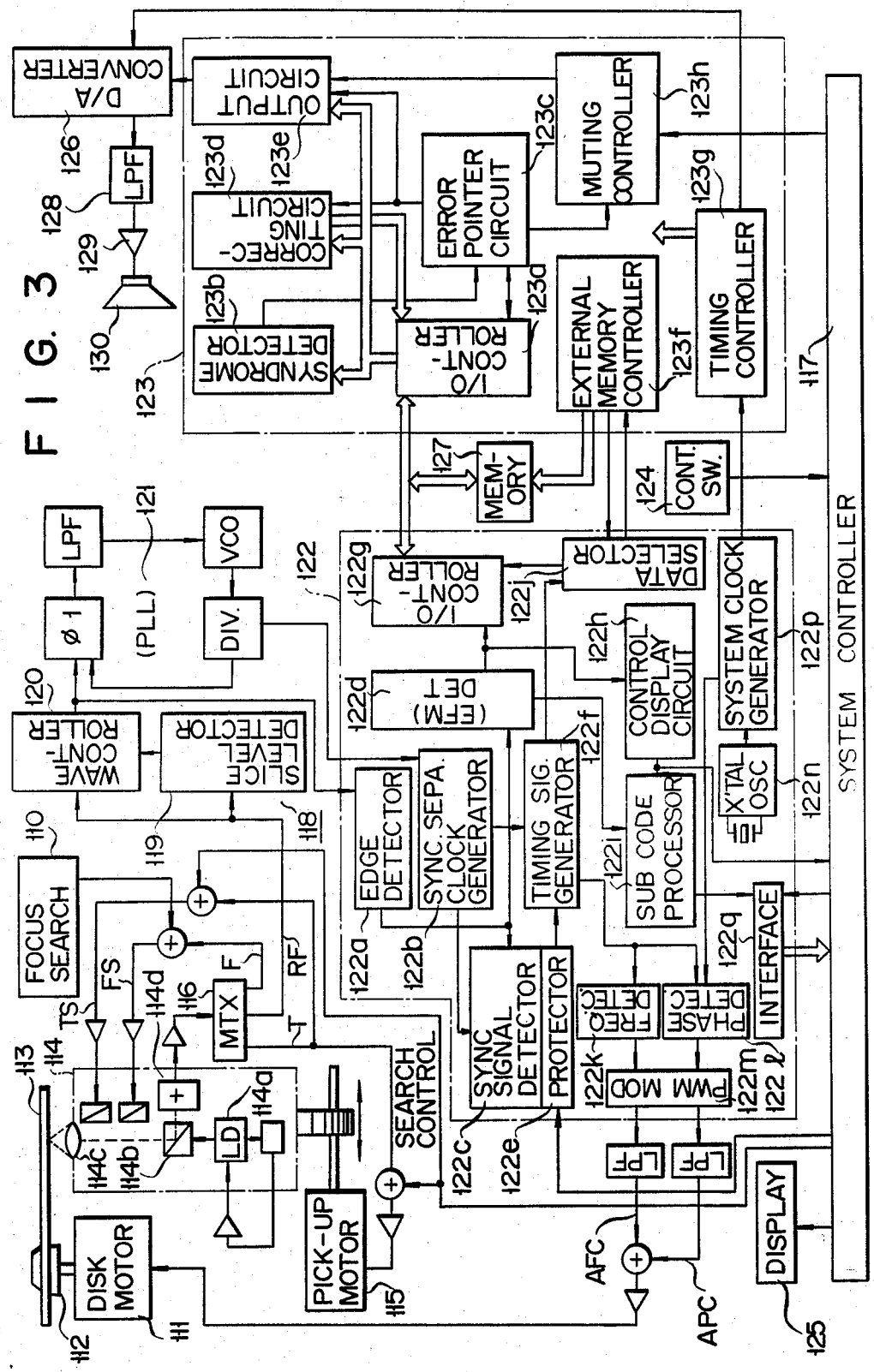
FIG. 3 is a block diagram of an optical DAD device to which the present invention is applied.

With reference to FIG. 3, an optical DAD (digital audio disk) device which uses compact disks (CD) will be described.

As shown in FIG. 3, the optical DAD device comprises a motor 111 for rotating a turntable 112. On the turntable 112 an optical disk 113 is mounted. The disk 113 has pits which correspond to digital audio signals (i.e. PCM codes) which have been EFM-modulated and interleaved. An optical pickup 114 emits a laser beam from a semiconductor laser 114a. The laser beam passes through a beam splitter 114b and is focused by an objective lens 114c. The beam illuminates the track of the optical disk 113, i.e., a train of pits which cause an interference between an incident laser beam and a reflected laser beam in various ways. The beam reflected from the pits passes through the objective lens 114c and the beam splitter 114b. It is then guided to a four-element photodetector 114d. The photodetector 114d converts the laser beam into four signals. The pickup 114 is moved by a pickup feed motor 115 in the radial direction of the optical disk 113.

The four signals from the photodetector 114d are supplied to a matrix circuit 116 and undergo a specific matrix operation. As a result, the matrix circuit 116 generates a focus error signal F, a tracking error signal T and a high-frequency signal RF. The focus error signal F and a focus search signal from a focus search circuit 110 drive a focus servo system of the optical pickup 114. The tracking error signal T and search control signal from a system controller 117 drive a tracking servo system of the pickup 114 and control the pickup feed motor 115. The high-frequency signal RF is supplied to a reproduced signal processing system 118 as a major reproduced signal component. In the system 118 the signal RF is supplied to a waveform shaping circuit 120 which is controlled by a slice level (eye pattern) detector 119. The waveform shaping circuit 120 divides the input signal into an unnecessary analog component and a necessary data component. The necessary data component is supplied to a sync clock reproducing circuit 121 of PLL type and also to an edge detector 122a of a first signal processing system 122.

A sync clock from the sync clock reproducing circuit 121 is supplied to a clock pulse generating circuit 122b. In response to the sync clock, the clock pulse generating circuit 122b generates a clock pulse for dividing a sync signal into components. On the other hand, the necessary data component from the edge detector 122a is supplied to a sync signal detector 122c. The sync signal detector 122c divides the data components in response to a sync signal dividing clock pulse from the clock pulse generating circuit 122b. The necessary data component from the edge detector 122a is also supplied to a demodulating circuit 122d and then EFM-demodulated. A sync signal from the sync signal detector 122c is supplied to a sync signal protecting circuit 122e and then to a timing signal generating circuit 122f. A clock pulse signal from the clock pulse generating circuit 122b is also supplied to the timing signal generating circuit 122f. The timing signal generating circuit 122f generates a timing signal for processing input data.

An output signal from the demodulating circuit 122d is supplied through a data bus input/output control circuit 122g to an input/output control circuit 123a of a second signal processing system 123. The output signal from the demodulating circuit 122d contains a sub-code (i.e., a control signal) and a display signal component. The display signal component is supplied to a sub-code processing circuit 122$_i$.

The sub-code processing circuit 122$_i$ detects an error, if any, from the sub-code and corrects the error and then generates sub-code data. The sub-code data is supplied to the system controller 117 through an interface circuit 122$_q$ which is connected to the system controller 117.

The system controller 117 includes a microcomputer, an interface circuit and a driver integrated circuit. In response to an instruction from a control switch 124 the system controller 117 controls the DAD device in a desired manner and causes a display device 125 to display the sub-code, e.g., index data about a piece of music to be reproduced.

A timing signal from the timing signal generating circuit 122$f$ is supplied through a data selecting circuit 122$_j$ to the data bus input/output control circuit 122$g$ and controls the data bus input/output control circuit 122$g$. The timing signal is supplied also to a frequency detector 122$_k$ and a phase detector 122$_l$ and farther to a PWM modulator 122$_m$. The timing signal from the PWM modulator 122$_m$ then undergoes automatic frequency control (AFC) and automatic phase control (APC) so as to rotate the motor 111 at a constant linear velocity (CLV).

The phase detector 112$_l$ is connected to receive a system clock pulse from a system clock pulse generating circuit 122$_p$, which operates under the control of an output signal from a quartz crystal oscillator 122$_n$.

The demodulated data from the input/output control circuit 123a of the second signal processing system 123 is supplied through a data output circuit 123e to a D/A (digital-to-analog) converter 126 after it has undergone necessary error correction, de-interleaving and data supplementation at a syndrome detector 123b, and an error pointer control circuit 123c and error correction circuit 123d. The second signal processing system 123 includes an external memory control circuit 123f. The control circuit 123f cooperates with the data selecting circuit 122$_j$ of the first signal processing system 122 to control a memory circuit 127 which is provided outside the system 123 and which stores data necessary for correcting errors. Under the control of the circuits 123f and 122$_j$ the data are read from the external memory 127 and supplied to the input/output control circuit 123a.

The second signal processing system 123 further comprises a timing control circuit 123g and a muting control circuit 123$_h$. The timing control circuit 123g is designed so as to supply, in response to a system clock pulse from the system clock pulse generating circuit 122$_p$, a timing control signal which is necessary for correcting errors, supplementing data and converting digital data into analog data. The muting control circuit 123$_h$ is designed to operate in response to a control signal from the error pointer control circuit 123c or from the system controller 117, thus performing a specific muting control which is necessary in supplementing data and in starting and ending DAD reproduction.

An audio signal, or an analog output signal from the D/A converter 126 is supplied through a low-pass filter 128 and an amplifier 129 to a loudspeaker 130.

Now an apparatus according to the invention will be described which is used in the error correcting system of the optical DAD device shown in FIG. 3.

Figure 1:
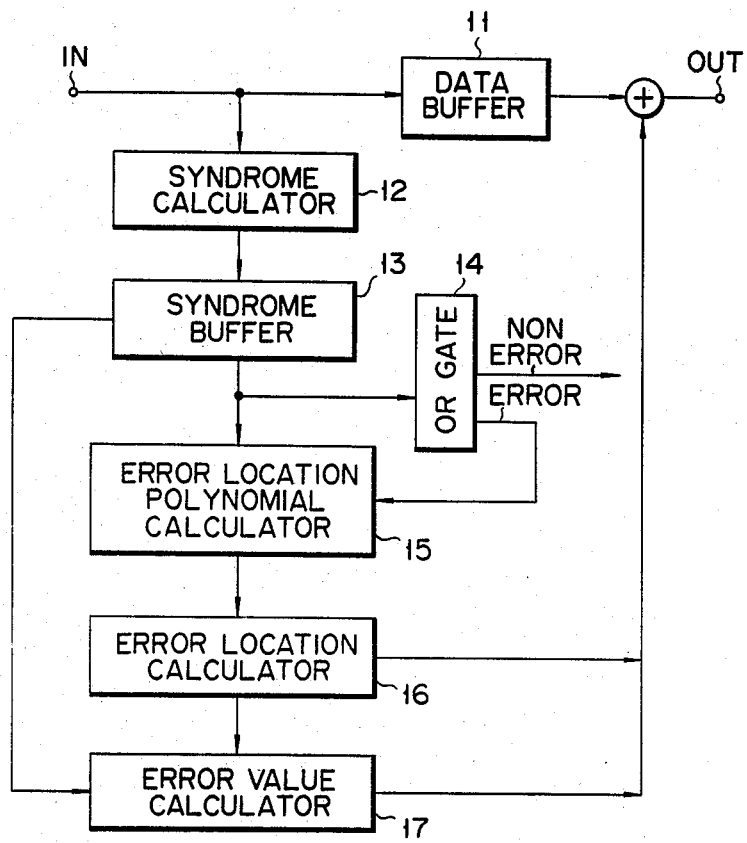
FIG. 1 shows a system for decoding a Reed Solomon code.
Figure 2:
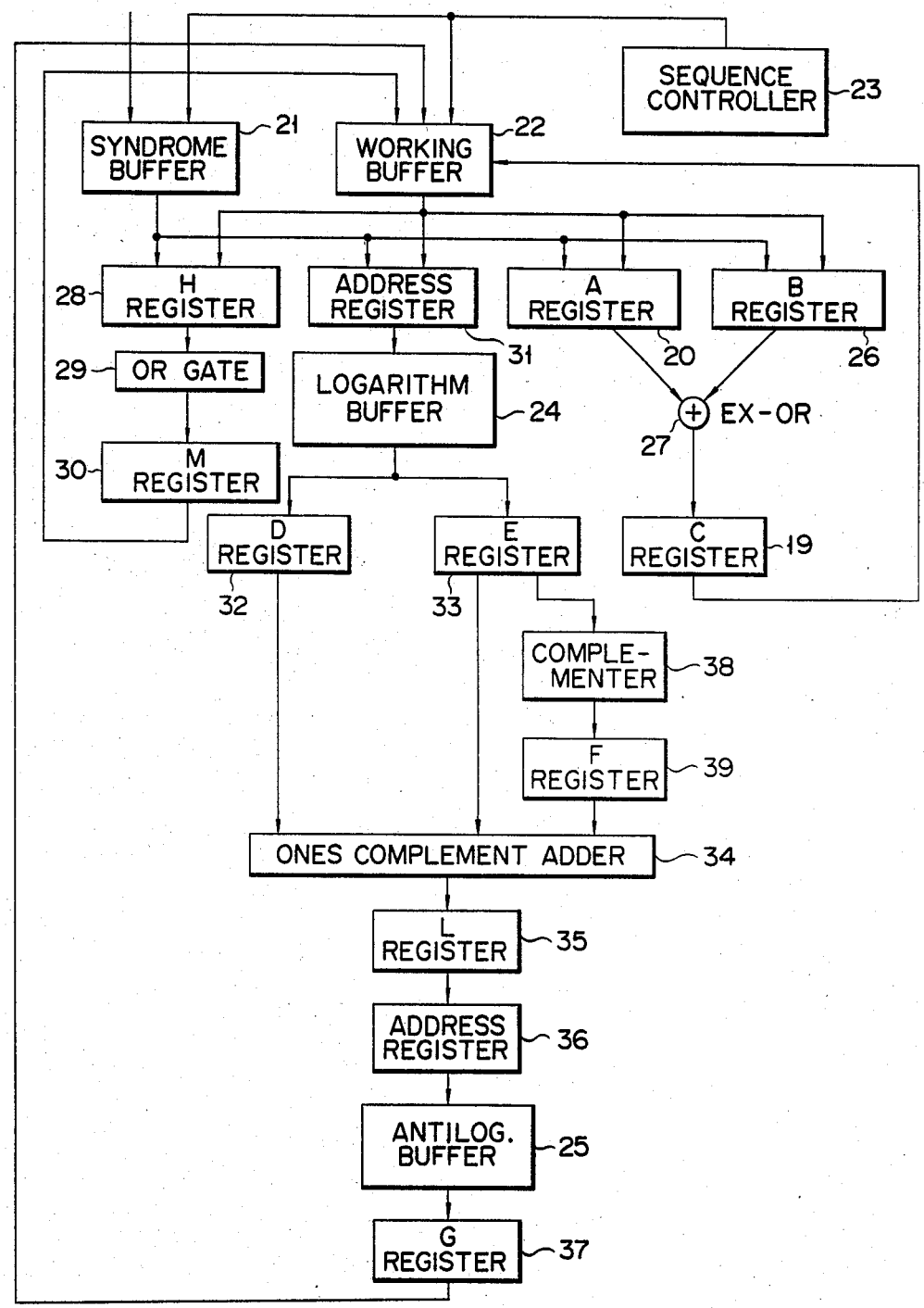
FIG. 2 schematically shows a conventional error location polynomial calculator.
Figure 4:
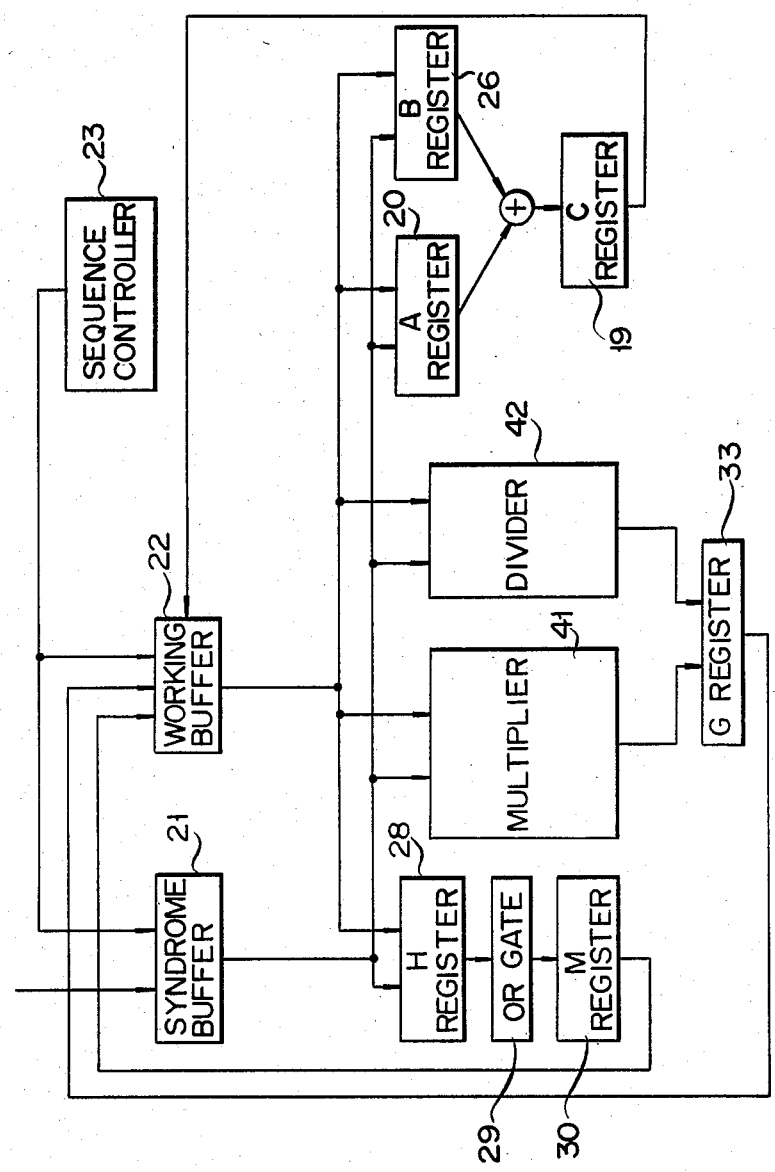
FIG. 4 is a block diagram of an apparatus according to the invention.

FIG. 4 shows an error location polynomial calculator provided in the error correcting circuit 123d of the second signal processing system 123. The calculator is identical to the conventional calculator shown in FIG. 2, except that it is provided with a multiplier 41 and a divider 42 which multiply and divide the elements of a Galois field. The apparatus of the invention can therefore divide the elements of a Galois field, although it has neither a logarithm buffer nor an antilogarithm buffer.

The function of the error location polynomial calculator is to perform various algebraic operations and thereby to decode an error correction code, i.e., a Reed Solomon code which is a BCH code. The calculator performs addition and detection of element "0" in the same way as the calculator shown in FIG. 2. It performs multiplication and division in different ways, however. How the calculator achieves multiplication and division will be described below in detail.

Element $\alpha^i$ of Galois field GF($2^8$), for example, is multiplied by element $\alpha^j$ of the Galois field GF($2^8$), where $\alpha$ is the root of a modulus polynomial $F_{(x)} = X^8 + X^6 + X^5 + X^4 + 1$. Let $\alpha^i$ and $\alpha^j$ be given as follows:

$$\alpha^i = C(\alpha) = c_0 + c_1\alpha + \ldots + c_7\alpha^7$$

$$\alpha^j = D(\alpha) = d_0 + d_1\alpha + \ldots + d_7\alpha^7,$$

where $c_0$–$c_7$ and $d_0$–$d_7$ are each either 1 or 0. Then:

$$\begin{aligned}
\alpha^i \cdot \alpha^j &= C(\alpha) \cdot D(\alpha) \\
&= d_7\alpha^7 C(\alpha) + d_6\alpha^6 C(\alpha) \ldots + d_0 C(\alpha) \\
&= \alpha^6[\alpha d_7 C(\alpha) + d_6 C(\alpha)] + d_5\alpha^5 C(\alpha) + \ldots + d_0 C(\alpha) \\
&= \alpha^5[\alpha[d_7 C(\alpha) + d_6 C(\alpha)] + d_5 C(\alpha)] + \\
&\quad d_4\alpha^4 C(\alpha) + \ldots + d_0 C(\alpha) \\
&= [\alpha[\alpha[\alpha[\alpha[\alpha[\alpha d_7 C(\alpha) + d_6 C(\alpha)] + d_5 C(\alpha)] + \\
&\quad d_4 C(\alpha)] + d_3 C(\alpha)] + d_2 C(\alpha)] + d_1 C(\alpha) + d_0 C(\alpha).
\end{aligned}$$

The equation given above shows that the multiplication, $\alpha^i \cdot \alpha^j$, can be performed by such a multiplier, or a linear shift register, as shown in FIG. 5.

The multiplier shown in FIG. 5 comprises AND gates AND$_0$ to AND$_7$. The coefficients $d_0$ to $d_7$ of the multiplier D($\alpha$) are supplied to the multiplier one after another. More specifically, the least significant bit $d_7$ is first supplied to one input of the AND gate AND$_0$, the second least significant bit $\alpha_6$ is then supplied to one input of the AND gate AND$_0$ while the bit $d_7$ is supplied to one input of the AND gate AND$_1$, the third least significant bit $\alpha_5$ is supplied to the AND gate AND$_0$ while the bits $\alpha_7$ and $\alpha_6$ are supplied to the AND$_2$ and AND$_1$, and so forth. The coefficients $c_0$ to $c_7$ of the multiplicand C($\alpha$) are simultaneously supplied to the other inputs of the AND gates AND$_0$ to AND$_7$, respectively. The multiplier further comprises flip-flop circuits FF$_0$ to FF$_7$ and exclusive OR gates EX-OR$_0$ to EX-OR$_7$. The flip-flop circuits FF$_0$ to FF$_7$ are connected by the exclusive OR gates EX-OR$_0$ to EX-OR$_7$ which are connected at one input to the outputs of the AND gates AND$_0$ to AND$_7$, respectively. The output of the flip-flop $FF_7$ is coupled by a feedback line to the other input of the flip-flop circuit $FF_0$. The flip-flop circuits $FF_0$ to $FF_7$ therefore form a linear shift register $SR_0$.

An exclusive OR gate $EX\text{-}OR_4'$ is connected at one input to the output of the exclusive $EX\text{-}OR_4$ and at the other input to the feedback line. Similarly, an exclusive OR gate $EX\text{-}OR_5'$ is connected at one input to the output of the exclusive OR gate $EX\text{-}OR_5$ and at the other input to the feedback line. In similar manner, an exclusive OR gate $EX\text{-}OR_6'$ is connected between the sixth flip-flop circuit $FF_5$ and the seventh flip-flop circuit $FF_6$. The clock terminals CK of the flip-flop circuits $FF_0$ to $FF_7$ are connected by a clock supply line to a clock pulse generator (not shown) so that a clock pulse may be supplied to the flip-flop circuits $FF_0$ to $FF_7$ at the same time.

The coefficients $d_0$ to $d_7$ of the multiplier $D(\alpha)$ are supplied one after another to the AND gates $AND_0$ and $AND_7$, respectively. Then, $X_0, X_1, X_2, \ldots X_7$ are calculated one after another, whereby the linear shift register $SR_0$ calculates $C(\alpha) \cdot D(\alpha)$. The output signals $x_0, x_1, \ldots x_7$ from the flip-flop circuits $FF_0$ to $FF_7$ therefore represent the product of the multiplicand $C(\alpha)$ and the multiplier $D(\alpha)$.

$x_0$ to $x_7$ are given as follows:

$$X_0 = d_7 C(\alpha)$$

$$X_1 = X_0 + d_6 C(\alpha)$$

$$X_2 = X_1 + d_5 C(\alpha)$$

$$X_3 = X_2 + d_4 C(\alpha)$$

$$X_4 = X_3 + d_3 C(\alpha)$$

$$X_5 = X_4 + d_2 C(\alpha)$$

$$X_6 = X_5 + d_1 C(\alpha)$$

$$X_7 = X_6 + d_0 C(\alpha) = (x_0, x_1, \ldots x_7)$$

The multiplier comprises a linear shift register instead of ROMs with large memory capacities which must store a logarithm table and an antilogarithm table of the elements of the Galois field $GF(2^8)$. By not using a logarithm buffer or an antilogarithm buffer, the multiplier is simple in structure, inexpensive, and can still multiply the elements of a Galois field $GF(2^m)$.

Element $\alpha^i$ of the Galois field $GF(2^8)$, for example, is divided by element $\alpha^j$ of the Galois field $GF(2^8)$, where $\alpha$ is the root of modulus polynomial $F_{(x)} = x^8 + x^6 + x^5 + x^4 + 1$. The division, $\alpha^i \div \alpha^j$ is expressed as follows:

$$\alpha^i \div \alpha^j = (\alpha^i \cdot \alpha^M) \div (\alpha^j \cdot \alpha^M),$$

where M is an integer.
If $$\alpha^j \cdot \alpha^M = \alpha^{255} = \alpha^0 = 1,$$

then:

$$\alpha^i \div \alpha^j = \alpha^i \cdot \alpha^M.$$

Hence, if $\alpha^j \cdot \alpha^M = 1$ when both dividend $\alpha^i$ and divider $\alpha^j$ are multiplied by $\alpha$, M times, the product of $\alpha^i$ and $\alpha^M$, i.e., $\alpha^i \cdot \alpha^M$ is the quotient of the division: $\alpha^i \div \alpha^j$. This is the basic idea of the present invention.

Needless to say, dividend $\alpha^i$ and divider $\alpha^j$ are multiplied by $\alpha$ several times by means of such linear shift registers as described above.

When divider $\alpha^j$ is $\alpha^1$, it must be multiplied by $\alpha$ as many as 254 times (M=254) until it is reduced to "1". That is, $\alpha^j \cdot \alpha^M = \alpha^{255} = \alpha^0 = 1$. Obviously, a long time is required to shift the linear shift register so many times in order to multiply divider $\alpha^j$ by $\alpha^{254}$.

According to the present invention, both dividend $\alpha^i$ and divider $\alpha^j$ are multiplied by $\alpha$ a proper number of times (N) before they are supplied to the linear shift registers, where N<M. It therefore suffices to shift the linear shift registers fewer times than otherwise until dividend $\alpha^i$ and divider $\alpha^j$ become "1". This shortens the time necessary for multiplication and, thus, the time necessary for the division $\alpha^i \div \alpha^j$.

Figure 6:
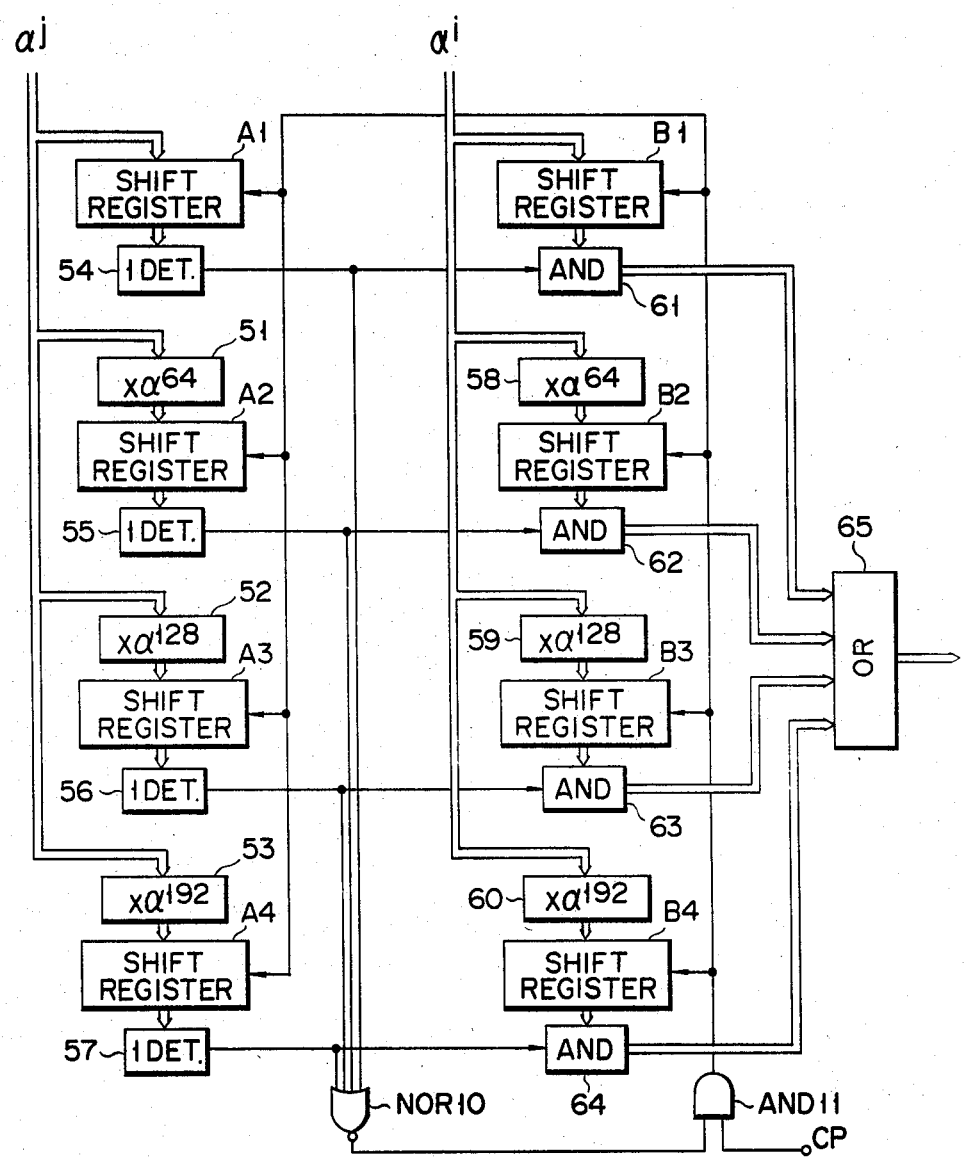
FIG. 6 is a block diagram of a divider used in the apparatus shown in FIG. 4.

FIG. 6 shows a divider for dividing the element of the Galois field $GF(2^m)$ in such a manner as described above. The divider is so designed that dividend $\alpha^i$ and divider $\alpha^j$ are multiplied by $\alpha$ N times before they are supplied to linear shift registers, where N=64, 128 or 192 ($1/n.2^m$, $2/n.2^m$, or $3/n.2^m$, m=8, n=4). In other words, dividend $\alpha^i$ and divider $\alpha^j$ are multiplied by $\alpha^{64}$, $\alpha^{128}$ or $\alpha^{192}$ before they are supplied to the linear shift registers.

More specifically, divider data $\alpha^j$ are supplied to a linear shift register $A_1$, to a linear shift register $A_2$ through an $\alpha^{64}$ multiplier circuit 51, to a linear shift register $A_3$ through an $\alpha^{128}$ multiplier circuit 52 and to a linear shift register $A_4$ through an $\alpha^{192}$ multiplier circuit 53. These linear shift registers $A_1$, $A_2$, $A_3$ and $A_4$ are identical to the linear shift register $SR_0$ shown in FIG. 5. They are shifted by a clock pulse $C_p$ supplied through an AND gate $AND_{11}$. Every time they are shifted, the data stored in them are multiplied by $\alpha$. The outputs of the linear shift registers $A_1$, $A_2$, $A_3$ and $A_4$ are supplied to "1" detector circuits 54, 55, 56 and 57, respectively. Each of the "1" detector circuits 54, 55, 56 and 57 generates an output signal when the contents of the linear shift register connected to it are "10000000" (=1). The outputs of the "1" detector circuits 54, 55, 56 and 57 are coupled to a 4-input NOR gate $NOR_{10}$. The output of the NOR gate $NOR_{10}$ is coupled to one input of the AND gate $AND_{11}$, the other input of which is connected to receive a clock pulse $C_p$. Hence, when any one of the "1" detector circuits 54 to 57 generates an output signal of logical "1", the NOR gate $NOR_{10}$ generates an output of logical "0", whereby the AND gate $AND_{11}$ stops supplying clock pulses $C_p$.

Dividend data $\alpha^i$ are supplied to a linear shift register $B_1$, a linear shift register $B_2$ through an $\alpha^{64}$ multiplier circuit 58, a linear shift register $B_3$ through an $\alpha^{128}$ multiplier circuit 59 and a linear shift register $B_4$ through an $\alpha^{192}$ multiplier circuit 60. They are shifted by a clock pulse $C_p$ supplied through the AND gate $AND_{11}$. Every time they are shifted, the data stored in them are multiplied by $\alpha$. The outputs of the linear shift registers $B_1$, $B_2$, $B_3$ and $B_4$ are supplied to AND circuits 61, 62, 63 and 64, respectively.

The AND circuits 61, 62, 63 and 64 are connected to the outputs of the "1" detector circuits 54, 55, 56 and 57, respectively. Hence, the AND circuit 61 supplies the logical product of the outputs from the "1" detector circuit 54 and shift register $B_1$. The AND circuit 62 produces the logical product of the outputs from the "1" detector circuit 55 and shift register $B_2$. Similarly, the AND circuits 63 and 64 generate the logical product of the outputs from the "1" detector circuit 56 and shift register $B_3$ and the logical product of the outputs from the "1" detector circuit 57 and shift register $B_4$, respectively.

The outputs from the AND circuits 61 to 64 are supplied to a 4-input OR circuit 65, whereby element $\alpha^i$ is divided by element $\alpha^j$.

Figure 7:
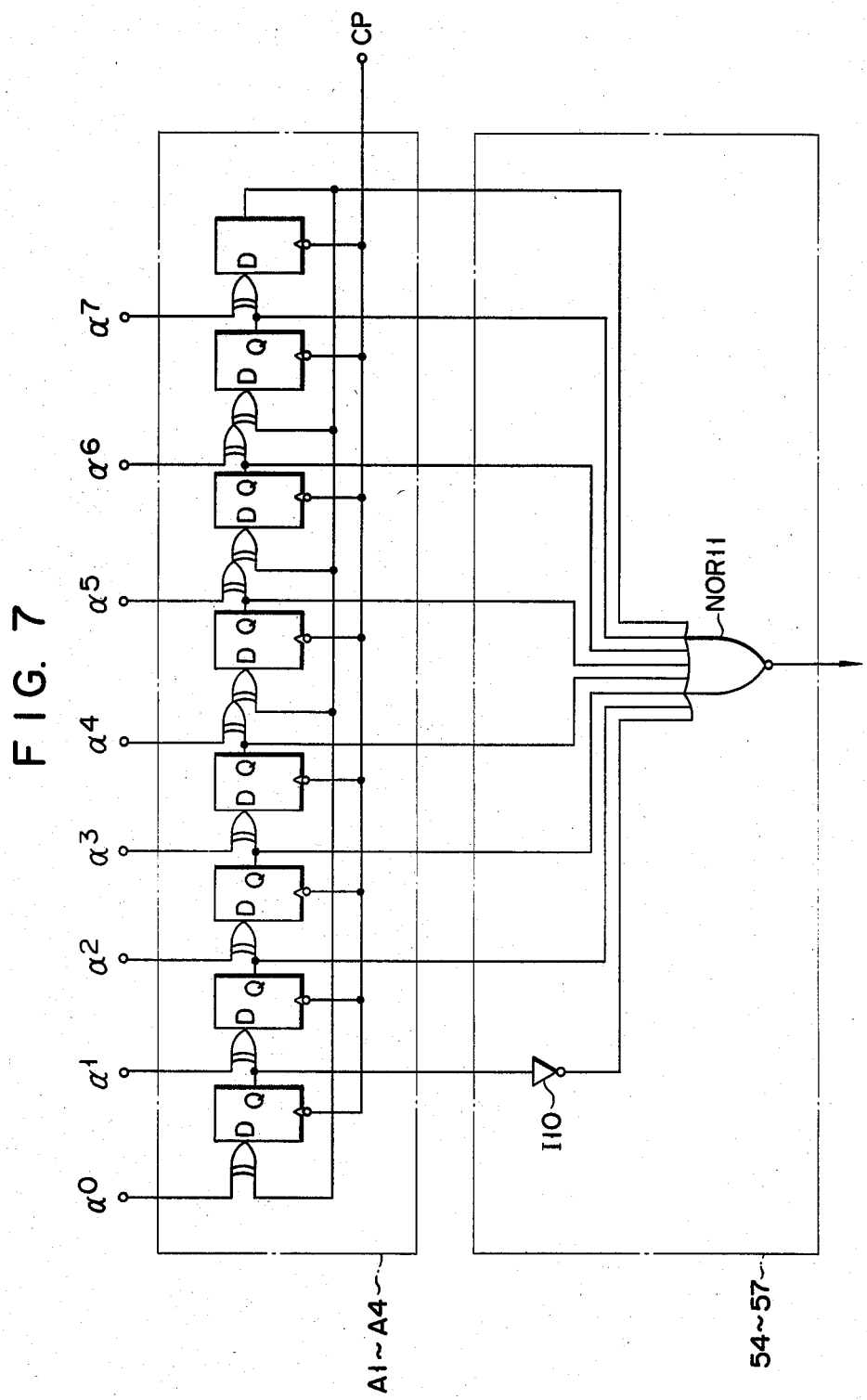
FIG. 7 shows one of the linear shift registers shown in FIG. 6 and the "1" detector circuit connected to the linear shift register.

The linear shift registers $A_1$ to $A_4$ have the same structure. As shown in FIG. 7, each linear shift register is an 8-bit register. The "1" detector circuits 54 to 57 have the same structure. As shown in FIG. 7, each "1" detector circuit is a NOR gate $NOR_{11}$ having eight input terminals. Only the bit of the shift register which corresponds to $\alpha^1$ is coupled to the first input terminal of the NOR gate $NOR_{11}$ through an inverter $I_{10}$. The second to eighth bits of the register are directly connected to the second to eighth input terminals of the NOR gate $NOR_{11}$, respectively.

Figure 8:
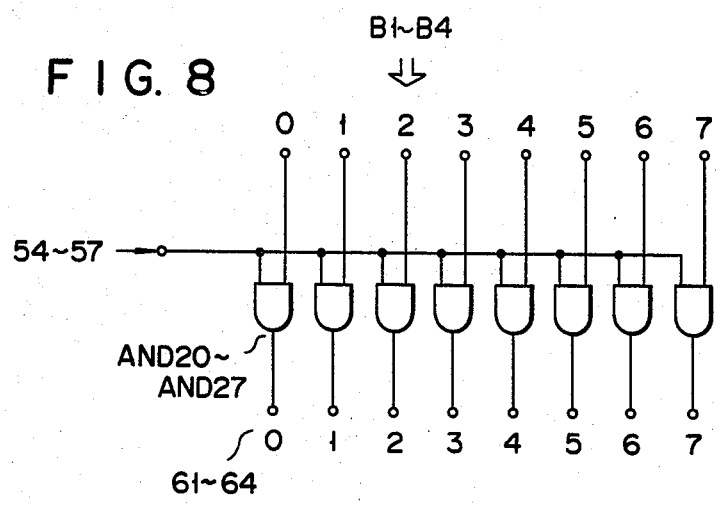
FIG. 8 shows the AND circuit section used in the divider shown in FIG. 6.

The AND circuits 61 to 64 have the same structure. As shown in FIG. 8, each AND circuit consists of eight AND gates $AND_{20}$ to $AND_{27}$ each with two input terminals. The AND gates $AND_{20}$ to $AND_{27}$ are connected at one input terminal to the corresponding linear shift register $B_1$, $B_2$, $B_3$ or $B_4$ which are 8-bit registers. More precisely, the AND gates $AND_{20}$ to $AND_{27}$ are connected at one input terminal to the first to eighth bits of the linear shift register, respectively. The AND gates $AND_{20}$ to $AND_{27}$ are coupled at the other input terminal to the corresponding "1" detector circuit 54, 55, 56 or 57.

Figure 9:
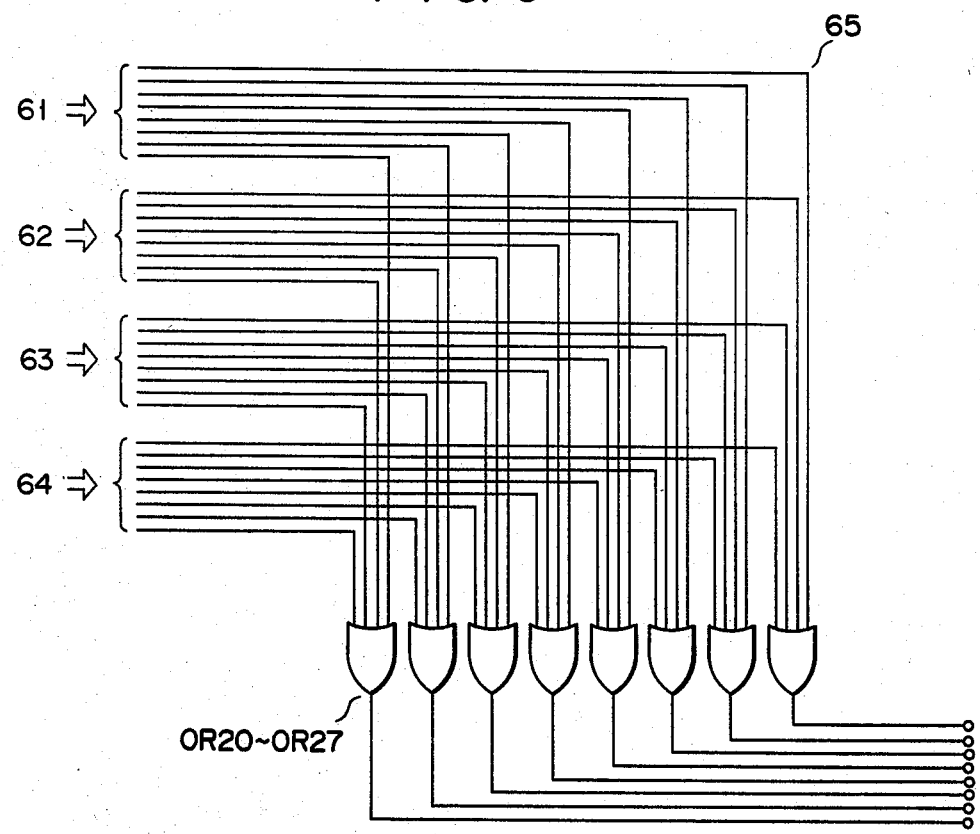
FIG. 9 shows the OR circuit section used in the divider shown in FIG. 6.

FIG. 9 shows the OR circuit 65 used in the divider shown in FIG. 6. The OR circuit 65 consists of eight 4-input OR gates $OR_{20}$ to $OR_{27}$. The OR gates $OR_{20}$ to $OR_{27}$ are connected at the first input terminal to the outputs of the eight AND gates of the AND circuit 61, respectively. They are coupled at the second input terminal to the outputs of the eight AND gates of the AND circuit 62. They are coupled at the third input terminal to the outputs of the eight AND gates of the AND circuit 63. And they are connected to the 4-input terminal to the outputs of the eight AND gates of the AND circuit 64, respectively.

Figure 10:
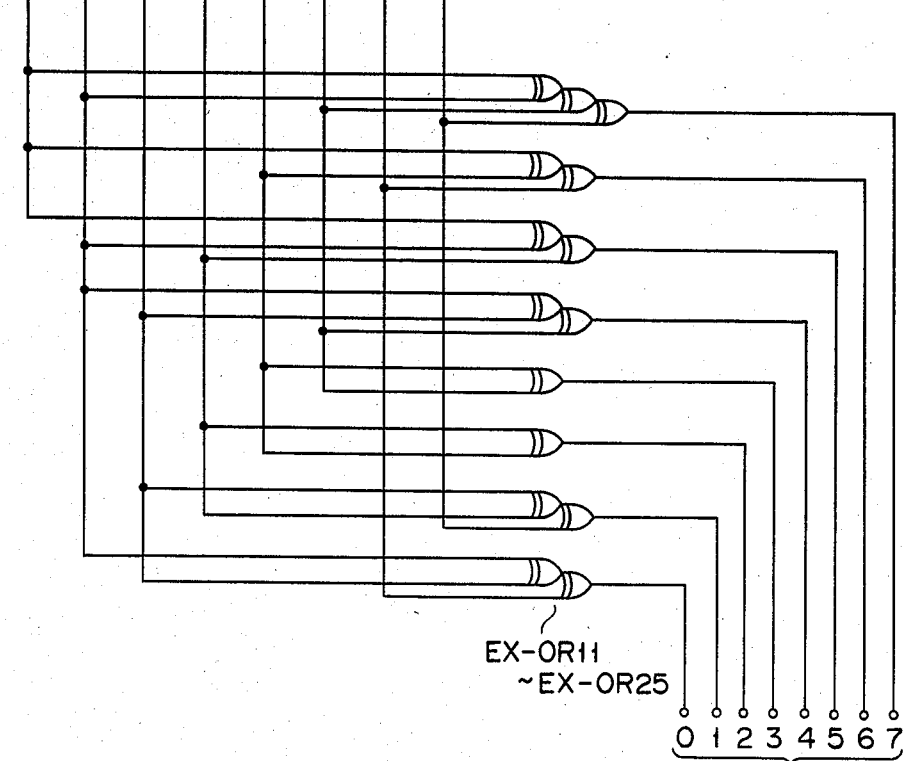
FIG. 10 is a circuit diagram of the $\alpha^{64}$ multiplier circuit used in the divider shown in FIG. 6.

FIG. 10 shows the $\alpha^{64}$ multiplier circuit 58 used in the divider shown in FIG. 6. The circuit 58 is designed upon the assumption that divider $\alpha^j$ is given as follows:

$$\alpha^j = B(\alpha) = b_7\alpha^7 + b_6\alpha^6 + \ldots b_1\alpha + b_0,$$

where $b_1$ to $b_7$ are 0 or 1.
Since $$\alpha^{64} = \alpha^7 + \alpha^6 + \alpha^5,$$

$$\begin{aligned}\alpha^{64} \cdot B(\alpha) &= (\alpha^7 + \alpha^6 + \alpha^5)(b_7\alpha^7 + \ldots + b_1\alpha + b_0) \\ &= (b_0 + b_1 + b_6 + b_7)\alpha^7 + (b_0 + b_4 + b_6)\alpha^6 + \\ &\quad (b_0 + b_1 + b_3)\alpha^5 + (b_1 + b_2 + b_5)\alpha^4 + \\ &\quad (b_4 + b_5)\alpha^3 + (b_3 + b_4)\alpha^2 + \\ &\quad (b_2 + b_3 + b_7)\alpha + (b_1 + b_2 + b_6).\end{aligned}$$

This algebraic operation is performed by exclusive-OR gates $EX\text{-}OR_{11}$ to $EX\text{-}OR_{25}$ which are connected as illustrated in FIG. 10. When data representing $B(\alpha)$ are supplied to the $\alpha^{64}$ multiplier circuit 58, the circuit 58 will generate output data representing $\alpha^{64} \cdot B(\alpha)$. The $\alpha^{128}$ multiplier circuit 59 and the $\alpha^{192}$ multiplier circuit 60 have structures which are similar to that of the $\alpha^{64}$ multiplier circuit 58. The divider shown in FIG. 6 divides $\alpha^{200}$ by $\alpha^{180}$ in the following manner, thus providing data representing $\alpha^{20}$. First, divider data $\alpha^{180}$ are stored in the linear shift registers $A_1$ to $A_4$ and dividend data $\alpha^{200}$ are stored in the linear shift registers $B_1$ to $B_4$, as shown below:

$$\begin{cases} \text{In register } A_1: \alpha^{180} \\ \text{In register } A_2: \alpha^{180} \cdot \alpha^{64} = \alpha^{244} \\ \text{In register } A_3: \alpha^{180} \cdot \alpha^{128} = \alpha^{53} \\ \text{In register } A_4: \alpha^{180} \cdot \alpha^{192} = \alpha^{372} = \alpha^{117} \end{cases}$$

$$\begin{cases} \text{In register } B_1: \alpha^{200} \\ \text{In register } B_2: \alpha^{200} \cdot \alpha^{64} = \alpha^{264} = \alpha^9 \\ \text{In register } B_3: \alpha^{200} \cdot \alpha^{128} = \alpha^{328} = \alpha^{73} \\ \text{In register } B_4: \alpha^{200} \cdot \alpha^{192} = \alpha^{392} = \alpha^{137} \end{cases}$$

Then, clock pulses $C_p$ are supplied from the AND gate $AND_{11}$ to the linear shift registers $A_1$ to $A_4$ and the linear shift registers $B_1$ to $B_4$. When the 11th clock pulse $C_p$ is supplied to the registers $A_1$ to $A_4$ and $B_1$ to $B_4$, the data stored in the register $A_2$ changes to $\alpha^{255} (=1)$. The "1" detector circuit detects this, and the NOR gate $NOR_{10}$ supplies an output of logical "0" to the AND gate $AND_{11}$. As a result, the AND gate $AND_{11}$ stops supplying clock pulses $C_p$ to the registers $A_1$ to $A_4$ and $B_1$ to $B_4$. At this time the data stored in the register $B_2$ represent $\alpha^{20}$. The data representing $\alpha^{20}$, i.e., the quotient of the division $\alpha^{200} \div \alpha^{180}$, are supplied through the AND circuit 62 and the OR circuit 65. The divider shown in FIG. 6 can therefore divide any element $\alpha^i$ of the Galois field $GF(2^8)$ by any other element $\alpha^j$ of the Galois field $GF(2^8)$ by multiplying the divider data stored in the linear shift register $A_1$, $A_2$, $A_3$ or $A_4$ and the dividend data stored in the linear shift register $B_1$, $B_2$, $B_3$ or $B_4$ by $\alpha$, 63 times at the most, in the case of $\alpha^j = \alpha^1$.

If more linear shift registers are used for multiplying both the divider $\alpha^j$ and the dividend $\alpha^i$ by $\alpha$, the divider $\alpha^j$ and the dividend $\alpha^i$ need to be multiplied by $\alpha$ fewer times until they are changed to $\alpha^{255}$.

Figure 11:
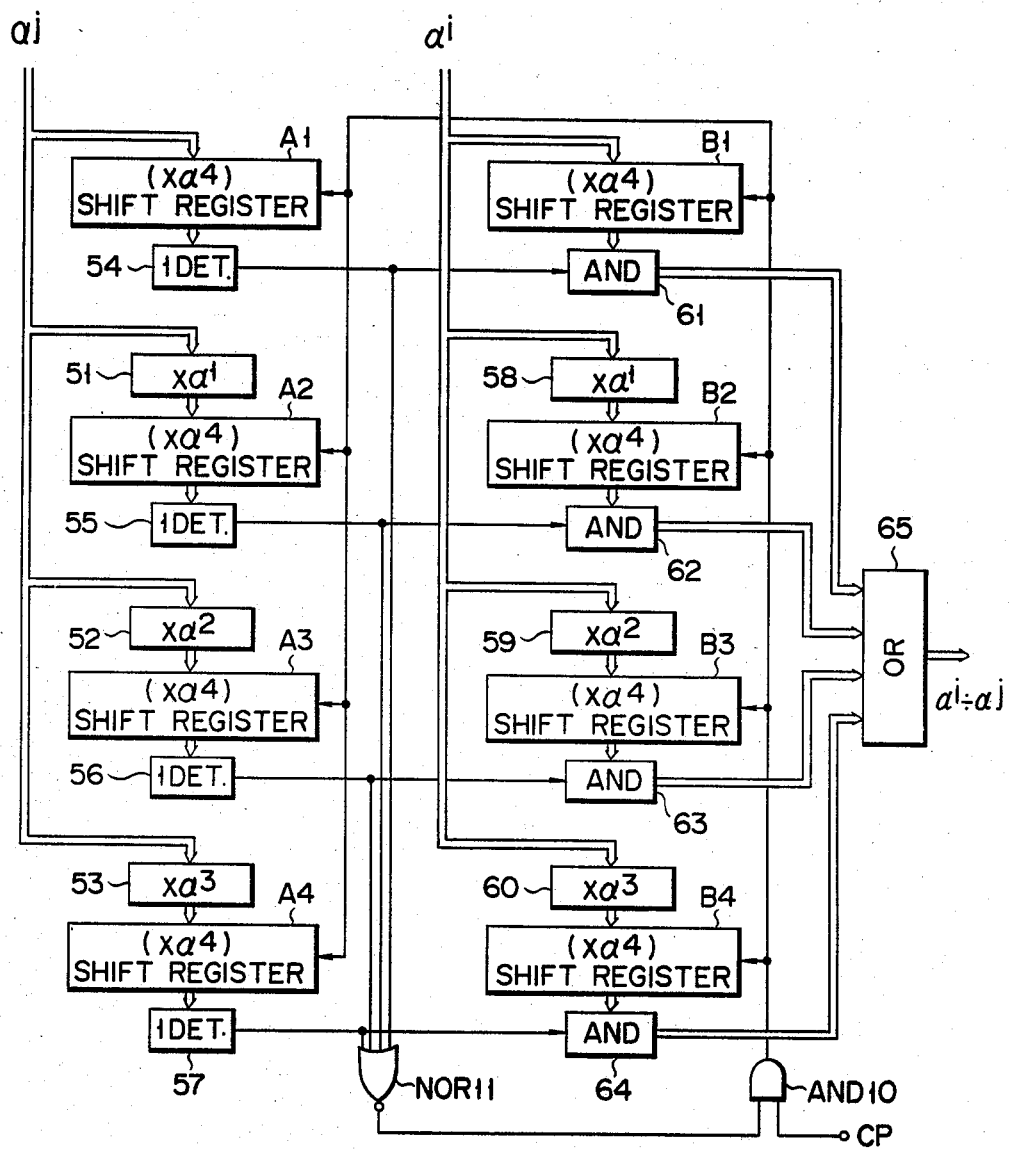
FIG. 11 is a block diagram of another divider according to the invention.

FIG. 11 shows another divider according to the present invention, which can divide the elements of the Galois field $GF(2^8)$ by performing multiplications of the elements. In this divider, both dividend $\alpha^i$ and divider $\alpha^j$ are multiplied by $\alpha$ N times before they are supplied to linear shift registers, where N=1, 2 and 3. In other words, dividend $\alpha^i$ and divider $\alpha^j$ are multiplied by $\alpha^1$, $\alpha^2$ and $\alpha^3$ before they are supplied to the linear shift registers. Both dividend $\alpha^i$ and divider $\alpha^j$ are then multiplied by $\alpha^4$ in the linear shift registers.

Figure 12:
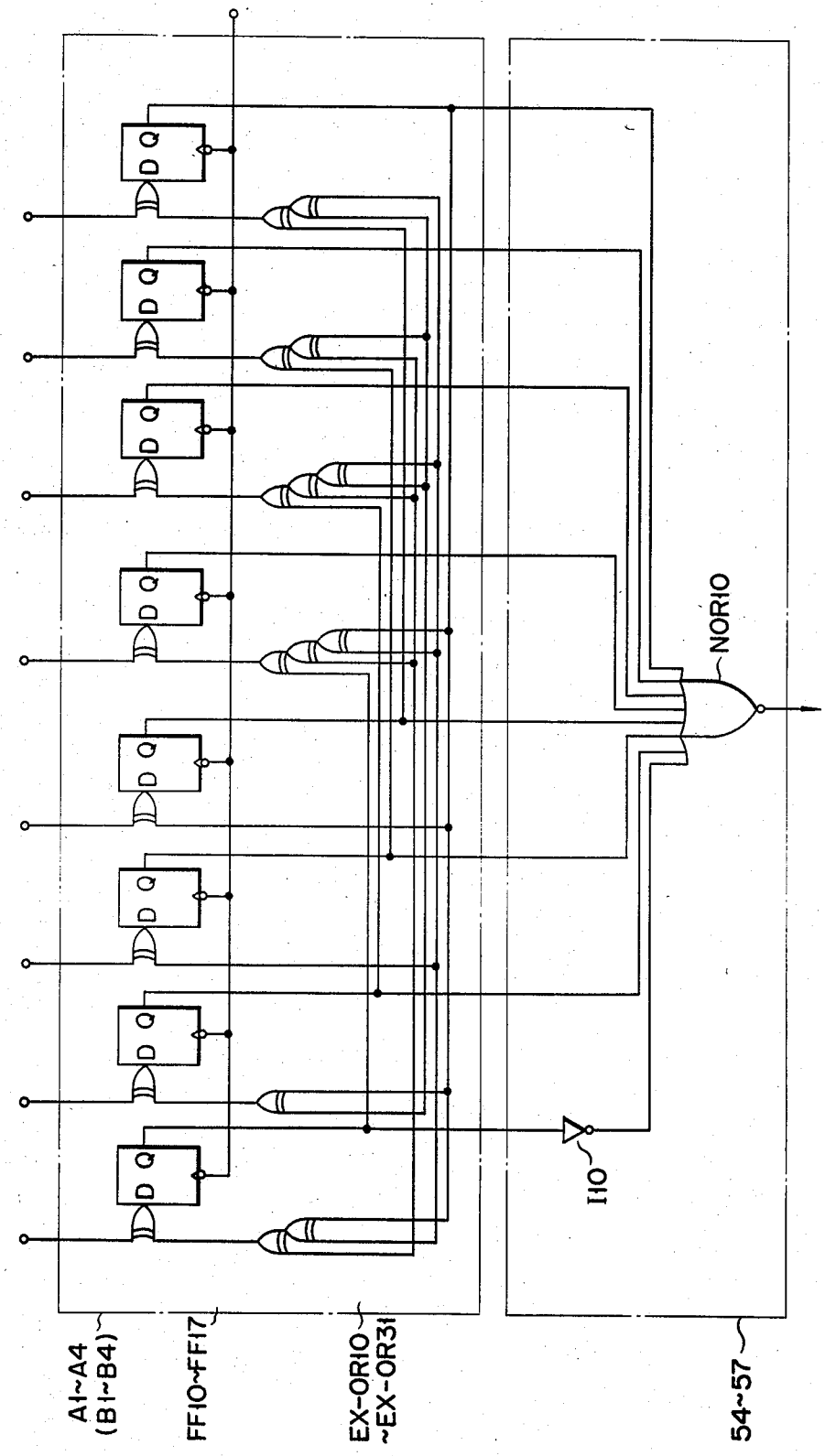
FIG. 12 shows one of the linear shift registers shown in FIG. 11 and the "1" detector circuit connected to the linear shift register.

More specifically, as shown in FIG. 11, divider data $\alpha^j$ are supplied to a linear shift register $A_1$, to a linear shift register $A_2$ through an $\alpha^1$ multiplier circuit 51, to a linear shift register $A_3$ through an $\alpha^2$ multiplier circuit 52, and to a linear shift register $A_4$ through an $\alpha^3$ multiplier circuit 53. The linear shift registers $A_1$, $A_2$, $A_3$ and $A_4$ are identical and have a structure as shown in FIG. 12. Each of the linear shift registers $A_1$ to $A_4$ is an 8-bit register. It comprises flip-flop circuits $FF_{10}$ to $FF_{17}$ and exclusive-OR gates $EX\text{-}OR_{10}$ to $EX\text{-}OR_{31}$. The flip-flop circuits $FF_{10}$ to $FF_{17}$ are cascade-connected and feedback-connected by the exclusive-OR gates $EX\text{-}OR_{10}$ to $EX\text{-}OR_{31}$. Every time a clock pulse $C_p$ is supplied to the linear shift registers $A_1$ to $A_4$ from an AND gate $AND_{10}$ shown in FIG. 11, the registers $A_1$ to $A_4$ are shifted to multiply the data stored in them by $\alpha^4$.

As shown in FIG. 11, the outputs of the linear shift registers A1, A2, A3 and A4 are connected to "1" detector circuits 54, 55, 56 and 57, respectively. Each of the "1" detector circuits 54 to 57 consists of one inverter $I_{10}$ and an 8-input NOR gate $NOR_{10}$ as shown in FIG. 12. It generates an output signal of logical "1" when the contents of the linear shift register connected to it are "10000000". The outputs of the "1" detector circuit 54, 55, 56 and 57 are coupled to the input terminals of a 4-input NOR gate $NOR_{11}$ (FIG. 11), respectively. The NOR gate $NOR_{11}$ generates an output signal of logical "0" when any one of the "1" detector circuits 54 to 57 generates an output of logical "1". The output of the NOR gate $NOR_{11}$ is connected to the AND gate $AND_{10}$. Hence, when an output of logical "0" is supplied from the NOR gate $NOR_{11}$ to the AND gate $AND_{10}$, the AND gate $AND_{10}$ stops supplying clock pulses $C_p$.

Dividend data $\alpha^i$ are supplied to a linear shift register $B_1$, to a linear shift register $B_2$ through an $\alpha^1$ multiplier circuit 58, to a linear shift register $B_3$ through an $\alpha^2$ multiplier circuit 59 and to a linear shift register $B_4$ through an $\alpha^3$ multiplier circuit 60. The linear shift registers $B_1$ to $B_4$ are shifted every time they receive a clock pulse $C_p$ from the AND gate $AND_{10}$, thereby multiplying the data stored in them by $\alpha^4$.

The outputs of the linear shift registers $B_1$, $B_2$, $B_3$ and $B_4$ are connected to AND circuits 61, 62, 63 and 64, respectively. The outputs of the "1" detector circuits 54, 55, 56 and 57 are connected to the AND circuits 61, 62, 63 and 64, respectively. Hence, the AND circuit 61 generates the logical product of the outputs from the "1" detector circuit 54 and shift register $B_1$. The AND circuit 62 produces the logical product of the outputs from the "1" detector circuit 55 and shift register $B_2$. The AND circuit 63 supplies the logical product of the outputs from the "1" detector circuit 56 and shift register $B_3$. Similarly, the AND circuit 64 generates the logical product of the outputs from the "1" detector circuit 57 and shift register $B_4$.

The outputs from the AND circuits 61 to 64 are supplied to a 4-input OR circuit 65, whereby element $\alpha^i$ is divided by element $\alpha^j$.

As shown in FIG. 8, each of the AND circuits 61 to 64 consists of eight AND gates $AND_{20}$ to $AND_{27}$ each with two input terminals. The AND gates $AND_{20}$ to $AND_{27}$ are connected at one input terminal to the corresponding linear shift registers $B_1$, $B_2$, $B_3$ and $B_4$ which are 8-bit registers. More precisely, the AND gates $AND_{20}$ to $AND_{27}$ are coupled at one input terminal to the first to eighth bits of the linear shift register, respectively. The AND gates $AND_{20}$ to $AND_{27}$ are coupled at the other input terminal to the corresponding "1" detector circuit 54, 55, 56 or 57.

The OR circuit 65 is identical with the circuit shown in FIG. 9. It consists of eight 4-input OR gates $OR_{20}$ to $OR_{27}$. The OR gates $OR_{20}$ to $OR_{27}$ are connected at the first input terminal to the outputs of the eight AND gates of the AND circuit 61, respectively. They are coupled at the second input terminal to the outputs of the eight AND gates of the AND circuit 62. They are coupled at the third input terminal to the outputs of the eight AND gates of the AND circuit 63. And they are connected at the fourth input terminal to the outputs of the eight AND gates of the AND circuit 64, respectively.

Figure 13:
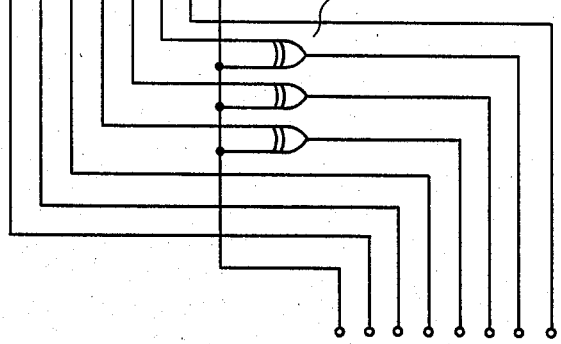
FIG. 13 is a circuit diagram of the $\alpha^1$ multiplier circuit used in the divider shown in FIG. 11.

FIG. 13 shows the $\alpha^1$ multiplier circuit 58 used in the divider shown in FIG. 11. The $\alpha^1$ multiplier circuit 58 is designed upon the assumption that divider $\alpha^j$ is given as follows:

$$\alpha^j = B(\alpha) = b_7\alpha^7 + b_6\alpha^6 + \ldots + B_1\alpha + b_0.$$

In this case, $\alpha \cdot B(\alpha)$ is expressed as follows:

$$\begin{aligned}\alpha \cdot b(\alpha) &= b_7\alpha^8 + b_6\alpha^7 + \ldots + b_1\alpha^2 + b_0 \\ &= b_6\alpha^7 + (b_5 + b_7)\alpha^6 + (b_4 + b_7)\alpha^5 + \\ &\qquad (b_3 + b_7)\alpha^4 + b_2\alpha^3 + b_1\alpha^2 + b_0.\end{aligned}$$

Therefore, the $\alpha^1$ multiplier circuit 58 is comprised of exclusive-OR gates $EX\text{-}OR_{32}$ to $EX\text{-}OR_{34}$ which are connected as shown in FIG. 13. When the circuit 58 receives input data representing $B(\alpha)$, it generates output data representing $\alpha \cdot B(\alpha)$, i.e. the product of $B(\alpha)$ and $\alpha$.

The $\alpha^2$ multiplier circuit 59 and the $\alpha^3$ mutliplier circuit 60 have structures which are similar to that of the $\alpha^1$ multiplier circuit 68.

The divider shown in FIG. 11 divides element $\alpha^i$ of the Galois field $GF(2^8)$ by element $\alpha^j$ of the Galois field $GF(2^8)$ in the following manner.

First, divider data $\alpha^j$ are supplied to the linear shift register $A_1$, to the linear shift register $A_2$ through the $\alpha^1$ multiplier circuit 51, to the linear shift register $A_3$ through the $\alpha^2$ multiplier 52 and to the linear shift register $A_4$ through the $\alpha^3$ multiplier circuit 53. At the same time, dividend data $\alpha^i$ are supplied to the linear shift register $B_1$, to the linear shift register $B_2$ through the $\alpha^1$ multiplier circuit 58, to the linear shift register $B_3$ through the $\alpha^2$ multiplier circuit 59 and to the linear shift register $B_4$ through the $\alpha^3$ multiplier circuit 60. The data stored in the shift registers $A_1$ to $A_4$ and the shift registers $B_1$ to $B_4$ are as listed below:

$$\begin{cases} \text{In register } A_1: \alpha^j \\ \text{In register } A_2: \alpha^{j+1} \\ \text{In register } A_3: \alpha^{j+2} \\ \text{In register } A_4: \alpha^{j+3} \end{cases}$$

$$\begin{cases} \text{In register } B_1: \alpha^i \\ \text{In register } B_2: \alpha^{i+1} \\ \text{In register } B_3: \alpha^{i+2} \\ \text{In register } B_4: \alpha^{i+3} \end{cases}$$

Then, clock pulses $C_p$ are supplied from the AND gate $AND_{10}$ to the linear shift registers $A_1$ to $A_4$ and the linear shift registers $B_1$ to $B_4$. Every time the shift registers $A_1$ to $A_4$ and $B_1$ to $B_4$ receive a clock pulse $C_p$, they are shifted, thereby multiplying the data stored in them by $\alpha^4$. When the data stored in any one of the shift registers $A_1$ to $A_4$ are changed to $\alpha^{255}$ ($=1$), the "1" detector circuit connected to the shift register generates an output signal of logical "1". As a result, the AND gate $AND_{10}$ stops supplying clock pulses $C_p$ to the shift registers $A_1$ to $A_4$ and $B_1$ to $B_4$. At the same time, the linear shift register $B_1$, $B_2$, $B_3$ or $B_4$ which corresponds to the shift register now storing data $\alpha^{255}$ ($=1$) supplies its contents to the AND circuit to which it is connected. The contents of the linear shift register $B_1$, $B_2$, $B_3$ or $B_4$, which represent the quotient of division $\alpha^i \div \alpha^j$, are delivered from the OR circuit 65.

More specifically, the divider shown in FIG. 11 divides element $\alpha^{10}$ of the Galois field $GF(2^8)$ by element $\alpha^{240}$ of the Galois field GF($2^8$) in the following manner so as to obtain the quotient $\alpha^{-230}$ ($=\alpha^{10-240}=\alpha^{-230+250}=\alpha^{25}$).

First, divider data $\alpha^{240}$ are supplied to the linear shift register $A_1$. The data are supplied also to the linear shift registers $A_2$, $A_3$ and $A_4$ through the $\alpha^1$ multiplier circuit 51, $\alpha^2$ multiplier circuit 52 and $\alpha^3$ multiplier circuit 53, respectively. At the same time, dividend data $\alpha^{10}$ are supplied to the linear shift register $B_1$. The data $\alpha^{10}$ are also supplied to the linear shift register $B_2$, $B_3$ and $B_4$ through the $\alpha^1$ multiplier circuit 58, $\alpha^2$ multiplier circuit 59 and $\alpha^3$ multiplier circuit 60, respectively. The shift registers $A_1$ to $A_4$ and the shift registers $B_1$ to $B_4$ then store the data listed below:

$$\begin{cases} \text{In register } A_1: \alpha^{240} \\ \text{In register } A_2: \alpha^{241} \\ \text{In register } A_3: \alpha^{242} \\ \text{In register } A_4: \alpha^{243} \end{cases}$$

$$\begin{cases} \text{In register } B_1: \alpha^{10} \\ \text{In register } B_2: \alpha^{11} \\ \text{In register } B_3: \alpha^{12} \\ \text{In register } B_4: \alpha^{13} \end{cases}$$

Clock pulses $C_p$ are then supplied one after another from the AND gate 10 to the shift registers $A_1$ to $A_4$ and $B_1$ to $B_4$. When the third clock pulse $C_p$ is supplied to the shift registers $A_1$ to $A_4$ and $B_1$ to $B_4$, the data stored in the shift registers are multiplied by $\alpha^{12}$ ($=\alpha^4 \cdot \alpha^4 \cdot \alpha^4$). Hence, the shift registers $A_1$ to $A_4$ and $B_1$ to $B_4$ store the following data:

$$\begin{cases} \text{In register } A_1: \alpha^{252} \\ \text{In register } A_2: \alpha^{253} \\ \text{In register } A_3: \alpha^{254} \\ \text{In register } A_4: \alpha^{255} \end{cases}$$

$$\begin{cases} \text{In register } B_1: \alpha^{22} \\ \text{In register } B_2: \alpha^{23} \\ \text{In register } B_3: \alpha^{24} \\ \text{In register } B_4: \alpha^{25} \end{cases}$$

The register $A_4$ now stores data $\alpha^{255}$ ($=1$). The data $\alpha^{25}$ stored in the shift register $B_4$ which corresponds to the register $A_4$ are therefore supplied as the quotient from the OR circuit 65.

As described above, the linear shift registers $A_1$ to $A_4$ and $B_1$ to $B_4$ multiply the data stored in them by a $\alpha^4$ every time they are shifted. The divider of FIG. 11 can therefore divide any element $\alpha^1$ of the Galois field GF($2^8$) by another element $\alpha^j$ of the Galois field GF($2^8$) by multiplying both the dividend $\alpha^i$ and the divider $\alpha^j$ by $\alpha$, 63 times at most, in the case where $\alpha^j=\alpha^1$.

Two linear shift registers $A_5$ and $B_5$ may be used in addition to the shift registers $A_1$ to $A_4$ and $B_1$ to $B_4$ and two $\alpha^5$ multiplier circuits may be connected to the inputs of the registers $A_5$ and $B_5$, respectively. In this case, the division $\alpha^j \div \alpha^j j$ can be performed by multiplying both dividend $\alpha^i$ and divider $\alpha^j$ by $\alpha$, 50 times at least.

The present invention is not limited to the embodiments described above. Various changes and modifications are possible within the scope of the invention. For example, the apparatus of the invention may be used in combination with a system for recording, reproducing and transmitting digital data such as PCM data, a system for processing such data or any other system in which one of the elements of the Galois field needs to be divided by another element of the Galois field.

As described above in detail, the present invention can provide an apparatus for dividing the elements of a Galois field, which has neither a logarithm buffer nor an antilogarithm buffer, both of which need to have a large memory capacity, and which therefore has a simple structure and can be manufactured inexpensively, and which can still operate at a high speed.

What we claim is:

1. An apparatus for dividing one element $\alpha^i$ of a Galois field GF($2^m$) consisting of $2^m$ elements by another element $\alpha^j$, thus performing a division of $\alpha^i \div \alpha^j$, where $\alpha$ is the root of a modulus polynominal $F_{(x)}$, said apparatus comprising:

a first linear shift register for storing data representing the element $\alpha_j$;

a second linear shift register for storing data representing the element $\alpha^i$;

a first "1" detector circuit connected to the output of said first linear shift register;

first shift means for detecting the number of times said first "1" detector circuit produces no output and for generating a shift signal to shift said first and second linear shift registers M times according to the detecting result; and first output means for providing, as a quotient of the division $\alpha^i \div \alpha^j$, that output $\alpha^i \cdot \alpha^M$ of said second linear shift register which is obtained when the output of said first linear shift register controlled by said first shift means becomes $\alpha^j \cdot \alpha^M = 1$, when said first output means receives a "1" detection output of said first "1" detector circuit which is obtained when said first "1" detector circuit detects that $\alpha^j \cdot \alpha^M = 1$.

2. An apparatus according to claim 1, further comprising:

at least one first multiplier circuit for multiplying the element $\alpha^j$ by a predetermined multiplier $\alpha^N$;

at least one second multiplier circuit for multiplying the element $\alpha^i$ by the predetermined multiplier $\alpha^N$;

at least one third linear shift register for receiving the output of said first multiplier circuit;

at least one fourth linear shift register for receiving the output of said second multiplier circuit;

at least one second "1" detector circuit coupled to the output of said third linear shift register;

at least one second shift means for detecting the number of times said second "1" detector circuit produces no output and producing a shift signal to shift said third and fourth linear shift registers M times according to the detection result; and at least one second output means for providing, as a quotient of the division $\alpha^i \div \alpha^j$, that output $\alpha^i \cdot \alpha^N \cdot \alpha^M$ of said fourth linear shift register which is obtained when the output of said third linear shift register controlled by said second shift means becomes $\alpha^j \cdot \alpha^N \cdot \alpha^M = 1$, in response to a "1" detection output of said second "1" detector circuit which is obtained when said second "1" detector circuit detects that $\alpha^j \cdot \alpha^N \cdot \alpha^M = 1$.

3. An apparatus according to claim 2, wherein the power N of the multiplier $\alpha^N$ for said first and second multiplier circuits is a multiple of $1/n\ 2^m$ ($n \geq 2$).

4. An apparatus according to claim 2, wherein the power N of the multiplier $\alpha^N$ for said first and second multiplier circuits is a multiple of 1.

5. An apparatus according to claim 1, wherein when shifted, each of said first and second linear shift registers provides data that equals stored data multiplied by $\alpha$ for each shifting.

6. An apparatus according to claim 1, wherein when shifted, each of said first and second linear shift registers provides data that equals stored data multiplied by $\alpha^{NO}$ ($NO \geq 2$) for each shifting.

* * * * *